US008648525B2

(12) United States Patent
Chiba et al.

(10) Patent No.: US 8,648,525 B2
(45) Date of Patent: Feb. 11, 2014

(54) TRANSPARENT ELECTRODE, PURIFYING METHOD OF CONDUCTIVE FIBERS EMPLOYED IN TRANSPARENT ELECTRODE AND ORGANIC ELECTROLUMINESCENCE ELEMENT

(75) Inventors: Takato Chiba, Tokyo (JP); Shinichi Kurakata, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 90 days.

(21) Appl. No.: 13/378,699

(22) PCT Filed: May 28, 2010

(86) PCT No.: PCT/JP2010/059106
§ 371 (c)(1),
(2), (4) Date: Dec. 16, 2011

(87) PCT Pub. No.: WO2010/150619
PCT Pub. Date: Dec. 29, 2010

(65) Prior Publication Data
US 2012/0098419 A1      Apr. 26, 2012

(30) Foreign Application Priority Data

Jun. 24, 2009    (JP) ................................. 2009-149729

(51) Int. Cl.
*H01J 1/62*      (2006.01)
*H01J 63/04*     (2006.01)

(52) U.S. Cl.
USPC ............ 313/503; 313/309; 313/504; 313/506

(58) Field of Classification Search
USPC .......... 313/309–311, 503, 504, 506, 351, 352
See application file for complete search history.

(56) References Cited

U.S. PATENT DOCUMENTS

| 6,538,367 | B1 * | 3/2003 | Choi et al. | 313/309 |
|---|---|---|---|---|
| 6,741,019 | B1 * | 5/2004 | Filas et al. | 313/355 |
| 2005/0056118 | A1 | 3/2005 | Xia | |
| 2007/0074316 | A1 * | 3/2007 | Alden et al. | 977/762 |
| 2008/0143906 | A1 * | 6/2008 | Allemand et al. | 349/43 |
| 2010/0039690 | A1 * | 2/2010 | Agrawal et al. | 359/265 |
| 2010/0252184 | A1 * | 10/2010 | Morimoto et al. | 156/241 |
| 2011/0018424 | A1 * | 1/2011 | Takada | 313/352 |

FOREIGN PATENT DOCUMENTS

| JP | 06-080422 | 3/1994 |
|---|---|---|
| JP | 06-273964 | 9/1994 |
| JP | 2006-519712 | 8/2006 |
| JP | 2009-129732 | 6/2009 |
| WO | 2006/113207 | 10/2006 |
| WO | 2009/063744 | 5/2009 |

* cited by examiner

*Primary Examiner* — Anh T. Mai
*Assistant Examiner* — Kevin Quarterman
(74) *Attorney, Agent, or Firm* — Lucas & Mercanti, LLP

(57) ABSTRACT

Disclosed are a transparent electrode with excellent optical transmittance and conductivity, a purifying method of conductive fibers employed in the transparent electrode and an organic electroluminescence element with reduced luminance unevenness and long product lifetime employing the transparent electrode. The transparent electrode of the invention comprises a transparent substrate and provided thereon, a transparent conductive layer containing conductive fibers and a transparent conductive material, featured in that the content rate of conductive fibers with an aspect ratio of not less than 100 contained in the transparent conductive layer is 99.00% or more.

9 Claims, 1 Drawing Sheet

TRANSPARENT ELECTRODE, PURIFYING METHOD OF CONDUCTIVE FIBERS EMPLOYED IN TRANSPARENT ELECTRODE AND ORGANIC ELECTROLUMINESCENCE ELEMENT

CROSS REFERENCE TO RELATED APPLICATION

This is a 371 of PCT/JP2010/059106 filed May 28, 2010, which in turn claimed the priority of Japanese Patent Application No. 2009-149729 filed Jun. 24, 2009, both applications are incorporated by reference herein.

TECHNICAL FIELD

This invention relates to a transparent electrode suitably used in various fields such as liquid crystal display elements, organic luminescence elements, inorganic electroluminescence elements, solar cells, electromagnetic wave shields, electronic papers or touch panels; a purifying method of conductive fibers employed in the transparent electrode; and an organic electroluminescence element comprising the transparent electrode.

TECHNICAL BACKGROUND

In recent years, along with an increased demand for thinner TVs, there have been developed display technologies for various systems such as liquid crystals, plasma, organic electroluminescence, and field emission. The transparent electrode is incorporated, as an essential constitutional component, in any of the displays with a different display technology system. Further, the transparent electrode has been an indispensable component in touch panels, cellular phones, electronic papers, various solar cells and various electroluminescence controlling elements, in addition to TVs.

Hitherto, as a transparent electrode, there has been mainly used an ITO transparent electrode having an indium-tin complex oxide (ITO) membrane produced by a vacuum deposition method or a sputtering process on a transparent base material such as glass or a transparent plastic film. However, the transparent electrode produced by a vacuum deposition method or a sputtering process is poor in productivity, high in production cost, and inferior in flexibility, and therefore, has problems in that it cannot be applied to devices in which flexibility is required.

In contrast, a method has been proposed which forms a transparent electrode by coating of particles of a metal such as ITO (for example, refer to Patent Document 1), but has problems in that conductivity enough to work as an electrode cannot be obtained. Calcination treatment of a metal oxide particle coating layer makes it possible to lower the resistance of the layer, however, the treatment cannot be applied to a transparent electrode which is formed on a resin substrate such as a plastic film.

As a method of forming a transparent electrode excellent in productivity, there has been proposed a method of form a transparent electrode by coating or printing of a coating liquid prepared by dissolving or dispersing conductive polymer materials represented by π-conjugated polymers in an appropriate solvent (for example, refer to Patent Document 2). However, this electrode has problems of lower electrical conductivity and poor transparency, as compared to a transparent electrode of a metal oxide such as ITO, which is prepared by a vacuum film formation method.

Further, a technology has been disclosed which employs conductive fibers such as carbon nanotubes (CNT) or metal nanowires. Furthermore, a technology has been proposed which achieves compatibility between high transparency and high conductivity by an electrode in which a part of conductive fibers is fixed onto a substrate by a transparent resin film and another part of conductive fibers protrudes or an electrode in which conductive fibers in the form of nanowires and a conductive polymer are present in the same layer (for example, refer to Patent Documents 3 and 4). However, this technology has problem in that there is a limit to achievement of compatibility between high transparency and high conductivity, and problem in poor durability and in short product lifetime.

A detailed study has not hitherto been made on a purifying method of conductive fibers. A purifying method of separating conductive fibers as impurities from metal nanowires has been proposed (for example, refer to Patent Document 5). However, when filtration is employed as a purifying method which removes minute amount of impurities from the conductive fibers, the purification is difficult because of the specific structure of conductive fibers with very high aspect ratio. A purifying method in which a minute amount of impurities was removed from the conductive fibers has been desired.

PRIOR ART LITERATURE

Patent Literature

Patent Document 1: Japanese Patent O.P.I. Publication No. 6-80422
Patent Document 2: Japanese Patent O.P.I. Publication No. 6-273964
Patent Document 3: Japanese Unexamined Patent Application Publication (Translation of PCT Application) No. 2006-519712
Patent Document 4: U.S. Patent Publication No. 2007-74316A1
Patent Document 5: U.S. Patent Publication No. 2005-56118A1

DISCLOSURE OF THE INVENTION

Problems to be Solved by the Invention

An object of the invention is to provide a transparent electrode with excellent optical transmittance and conductivity, a purifying method of conductive fibers employed in the transparent electrode, and an organic electroluminescence element with reduced luminance unevenness and long product lifetime comprising the transparent electrode.

Means for Solving the Above Problems

As described above, the conventional technique employing, as a transparent conductive material of a transparent electrode, a conductive polymer or particles of metal oxides such as ITO or even a transparent electrode comprising conductive fibers in addition to a transparent conductive material cannot provide excellent optical transmittance or conductivity.

The present inventors have conceived that a minute amount of impurities in the conductive fibers has an influence on the state in which the conductive fibers are present in plane or the surface smoothness of a transparent electrode, causes problems such as non-uniformity of conductive path, and results in shortening of product lifetime. So, they have found a method of separating and removing impurities from conductive fibers, and completed the invention of providing a transparent electrode with excellent optical transmittance, conductivity and surface smoothness employing the method.

The above object of the invention can be attained by the following constitutions:

1. A transparent electrode comprising a transparent substrate and provided thereon, a transparent conductive layer containing conductive fibers and a transparent conductive material, featured in that the content rate of conductive fibers with an aspect ratio of not less than 100 contained in the transparent conductive layer is 99.00% or more.

2. The transparent electrode of item 1 above, featured in that the content rate of the conductive fibers with an aspect ratio of not less than 100 is 99.50% or more.

3. The transparent electrode of item 1 or 2 above, featured in that the conductive fibers have an average minor axis length of from 30 nm to less than 100 nm, and an average major axis length of from 10 µm to less than 30 µm.

4. A purifying method of the conductive fibers employed in the transparent electrode of any one of items 1 through 3 above, featured in that purifying of the conductive fibers is carried out employing a filter having a surface filtration mechanism.

5. The purifying method of item 4 above, featured in that the filter having a surface filtration mechanism is in the form of mesh.

6. The purifying method of item 4 or 5 above, featured in that a circle converted average pore size of the filter having a surface filtration mechanism is larger than the average minor axis length of the conductive fibers and smaller than the average major axis length of the conductive fibers.

7. The purifying method of any one of items 4 through 6 above, featured in that the purifying is further carried out employing a filter having a depth filtration mechanism.

8. The purifying method of item 7 above, featured in that a pore size of the filter having a depth filtration mechanism is larger than the average minor axis length of the conductive fibers and smaller than the average major axis length of the conductive fibers.

9. An organic electroluminescence element employing the transparent electrode of any one of items 1 through 3 above.

Effects of the Invention

The above constitutions of the present invention can provide a transparent electrode having advantages of high optical transmittance, low surface resistivity, and high surface smoothness, thereby providing a transparent electrode preferably applied to a current driving optoelectronics device or an organic EL device in which low surface resistivity and high electrode surface smoothness are required, and a mobile optoelectronics device in which light weight and flexibility are required. Further, conductive fibers with high purity can be obtained by a purifying method of conductive fiber employed in the preparation of the transparent electrode of the invention.

PREFERRED EMBODIMENT OF THE INVENTION

Figure 1A:
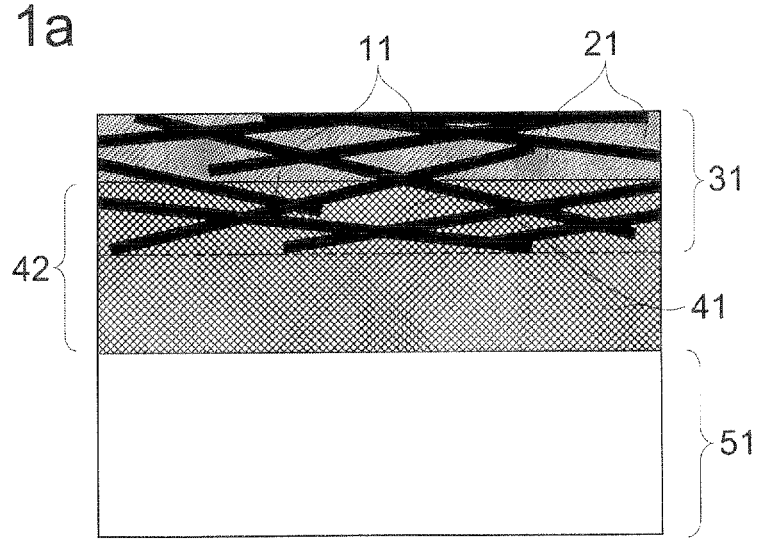
FIG. 1 shows a schematic view of the structure of the transparent electrode of the invention.

Next, the present invention will be explained in detail.

The transparent electrode of the invention is featured in that it comprises a transparent substrate and provided thereon, a transparent conductive layer containing conductive fibers and a transparent conductive material, and the content rate of conductive fibers with an aspect ratio of not less than 100 contained in the transparent conductive layer is 99.00% or more. The content rate in the transparent conductive layer of the conductive fibers of 99.00% or more, and preferably 99.50% or more can provide a transparent electrode with excellent optical transmittance and conductivity and high surface smoothness.

In the invention, "Transparent" means that the total optical transmittance in the visible wavelength region is 60% or more when measured according to a method specified in "Test Method of Total Light Transmittance of Plastic-Transparent Material" in JIS K 7361 (corresponding to ISO 13468-1).

The impurities in the invention means particles except for conductive fibers with an aspect ratio of not less than 100 contained in the transparent conductive layer, and are not limited by the material. That is, inorganic or organic substances incorporated during preparation of a transparent electrode or conductive particles with an aspect ratio of less than 100 incorporated during preparation of conductive particles both are impurities which shorten product lifetime.

The reason that impurities has an adverse effect on the product lifetime is not clear, however, it is supposed that conductive fibers or conductive particles with a small aspect ratio causes non-uniformity of a conductive path in the region where the conductive fibers or conductive particles are concentrated or its vicinity, resulting in shortening of product lifetime. Further, it is supposed that incorporation of nonconductive organic or inorganic substances causes non-uniformity in the conductive fiber layer, resulting in non-uniformity of a conductive path. Furthermore, it is supposed that the impurities cause increase in the surface roughness of a layer containing conductive fibers, which results in concentration of electric field.

In the invention, it is preferred that the conductive fibers are fibers of at least one selected from metals and carbon or the surface smoothness of the transparent electrode satisfies the following formula:

$$0.1 \text{ nm} \leq Ra \leq 5 \text{ nm}$$

Next, the invention and its constitution and the preferred embodiment of the invention will be explained in detail.

<<Transparent Electrode>>

FIG. 1 shows a schematic view of the structure of the transparent electrode of the invention.

The transparent electrode of the invention comprises a transparent substrate 51 and provided thereon, a transparent conductive layer 31 containing conductive fibers 11 and transparent conductive material 21. There are no any other limitations in the constitution. For example, as is shown in FIG. 1, a transparent binder layer 42 comprising a transparent binder 41 may be provided.

In the embodiment of FIG. 1a, a transparent conductive material 21 exists in the gap on the surface side of the electrode having a three dimensional mesh structure (conductive network structure) formed from conductive fibers 11. The conductive fibers 11 constitutes the electrode surface together with the transparent conductive material 21 and at the same time, can function as an auxiliary electrode of the transparent conductive material 21. A transparent binder layer 42 is present between the transparent substrate 51 and the gap on the side of the transparent substrate 51 of the three dimensional structure of the conductive fibers 11, and fixes the transparent conductive layer 31 to the transparent substrate 51.

Figure 1B:
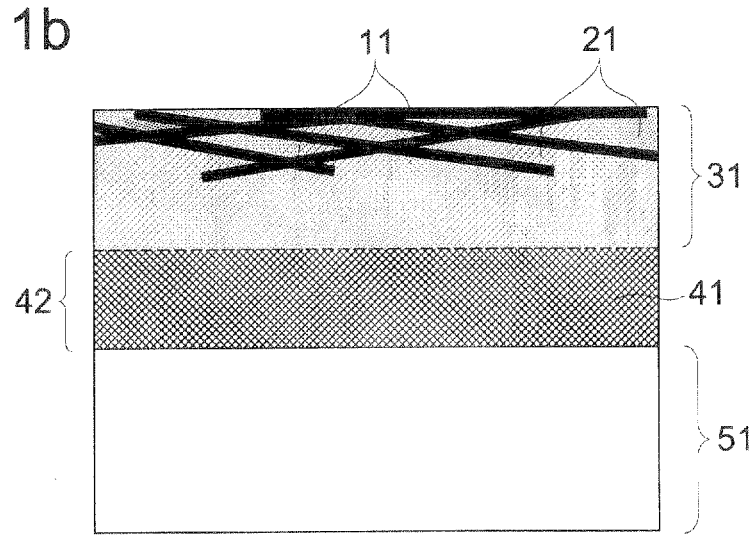

In the embodiment of FIG. 1b, the transparent conductive material 21 exists so as to enclose the three dimensional mesh structure formed from conductive fibers 11. The conductive fibers 11 constitute the surface of the electrode together with the transparent conductive material 21, and at the same time, can function as an auxiliary electrode of the transparent conductive material 21. The transparent binder layer 42 exists between the transparent conductive material 21 and the transparent substrate 51, and fixes the transparent conductive layer 31 to the transparent substrate 51. In this case, the transparent conductive material 21 may be in direct contact with the transparent substrate 51, in which the transparent binder layer 42 is not provided between the transparent conductive material 21 and the transparent substrate 51.

In the above embodiments, the transparent substrate may be subjected to the surface treatment as described above or may be provided with various functional layers as necessary.

The total optical transmittance of the transparent electrode in the invention is preferably not less than 60%, more preferably not less than 70%, and still more preferably not less than 80%. The total optical transmittance can be determined according to a method known in the art, employing a spectrophotometer.

Further, the electrical resistance of the transparent conductive layer of the transparent electrode of the invention is preferably not more than $1000\Omega/\square$, and more preferably not more than $100\Omega/\square$ in terms of surface resistivity. When the transparent electrode is applied to a current driving optoelectronics device, the electrical resistance value is preferably not more than $50\Omega/\square$, and more preferably not more than $10\Omega/\square$. When the electrical resistance value exceeds $10^3\Omega/\square$, the transparent electrode may not sufficiently function in various current driving optoelectronics devices.

The above surface resistivity can be determined, for example, based on JIS K7194: 1994 (Test method for resistivity of conductive plastics with a 4-pin probe measurement method) or can be conveniently determined employing a commercially available surface resistivity meter.

The thickness of the transparent electrode in the invention is not specifically limited, and can be appropriately selected depending on intended purposes. Generally, the thickness of the transparent electrode is preferably not more than 10 μm. The smaller thickness of the transparent electrode is more preferred, since transparency and flexibility increase.

[Transparent Substrate]

Transparent substrates employed in the present invention are not particularly limited as long as they exhibit high optical transparency. For example, appropriate substrates listed are glass substrates, resin substrates, and resin films in view of excellent hardness and easy formation of a conductive layer on their surfaces. However, in view of low weight and high flexibility, it is preferable to employ the transparent resin films.

Transparent resin films preferably employed in the present invention are not particularly limited, and their materials, shape, structure and thickness may be selected from those known in the art.

Examples of the transparent resin film include polyester film such as polyethylene terephthalate (PET) film, polyethylene naphthalate (PEN) film or modified polyester film; polyolefin film such as polyethylene (PE) film, polypropylene (PP) film, polystyrene film or cycloolefin resin film; vinyl resin film such as polyvinyl chloride film or polyvinylidene chloride film; polyether ether ketone (PEEK) film; polysulfone (PSF) film; polyethersulfone (PES) film; polycarbonate (PC) film; polyamide film; polyimide film; acrylic film; and triacetyl cellulose (TAC) film. If the resin films have a transmittance of 80% or more in the visible wavelength (380-780 nm), they are preferably applicable to the transparent resin film of the present invention.

As the transparent resin film, a biaxially-drawn polyethylene terephthalate film, a biaxially-drawn polyethylene naphthalate film, a polyethersulfone film and a polycarbonate film are preferred from a viewpoint of transparency, heat resistance, easy handling, strength and cost. Furthermore, biaxially-drawn polyethylene terephthalate film and a biaxially-drawn polyethylene naphthalate film are more preferred.

In order to secure the wettability and adhesion property of a coating solution, the transparent substrate used for the present invention can be subjected to surface treatment or provided with an adhesion assisting layer. With respect to surface treatment or an adhesion assisting layer, a well-known technique can be used.

Examples of the surface treatment include a surface activating treatment such as corona discharge treatment, flame treatment, ultraviolet treatment, high-frequency wave treatment, glow discharge process, active plasma treatment and laser treatment. Examples of materials used for the adhesion assisting layer include polyester, polyamide, polyurethane, a vinyl copolymer, a butadiene copolymer, an acrylic copolymer, a vinylidene copolymer and an epoxy copolymer.

When the transparent resin film is a biaxially-drawn polyethylene terephthalate film, it is more preferable to adjust so that the refractive index of the adhesion assisting layer which adjoins the transparent resin film is from 1.57 to 1.63, since reflection at an interface between the film substrate and the adhesion assisting layer is reduced to improve transmittance. Adjustment of the refractive index can be achieved by preparing a coating adjusting suitably the content ratio of oxide sol such as tin oxide sol or a cerium oxide sol having a comparatively high refractive index to the binder resin, and then coating it on the film substrate.

Although the adhesion assisting layer may be a single layer, it may be a structure of two or more layers in order to raise adhesion property. Moreover, a barrier coat layer may be beforehand formed on the transparent substrate, and a hard coat layer may be beforehand formed on the surface of the transparent substrate opposite the side on which a transparent conductive layer is transferred.

[Transparent Conductive Layer]

The transparent conductive layer in the present invention may contain a transparent binder material and an additive in addition to the conductive fibers and the transparent conductive material. The transparent resin is not specifically limited as long as it is a transparent resin capable of forming a coating solution. Examples of the transparent resin include a polyester resin, a polystyrene resin, an acrylic resin, a polyurethane resin, an acrylic urethane resin, a polycarbonate resin, cellulose resin and butyral resin. These can be used singly or as an admixture of two or more kinds thereof.

The thickness of the transparent conductive layer in the present invention varies depending on the shape or the content of conductive fibers or transparent conductive materials used, but as a rough target, it is preferably from the average diameter of the conductive fibers to 500 nm. It is preferable to decrease the thickness of the transparent conductive layer in the present invention by a pressing method which will be described later, since it is possible to form a dense network of the conductive fibers in the layer thickness direction.

In the present invention, Ry and Ra each represent the surface smoothness of the surface of the transparent conductive layer. Ry means a maximum height (the vertical interval between the summit part and a bottom part in the surface profile), and Ra an arithmetic mean roughness, both being specified based on JIS B601 (1994). In the transparent electrode in the present invention, a surface smoothness of the transparent conductive layer is preferably Ry≤50 nm and at the same time is preferably Ra≤5 nm. In the present invention, a commercially available atomic force microscope (AFM) can be used for measurement of Ry and Ra. For example, they can be measured according to the following method.

As an AFM, SPI3800N probe station and an SPA400 multifunctional-capability type module made by Seiko Instruments Co., Ltd., are used. The sample cut off in a square having a side of about 1 cm is set on a level sample stand on a piezo scanner, then, a cantilever is allowed to approach to the sample surface. When the cantilever reaches the region where an atomic force functions, the cantilever is scanned in the XY direction, and irregularity of the sample surface is caught as displacement of the piezo element in the Z direction. As the piezo scanner, a piezo scanner capable of scanning the XY direction of 20150 μm and the Z direction of 25 μm is used for the measurement. The cantilever used is a silicon cantilever SI-DF20 produced by Seiko Instruments Co., Ltd. with a resonant frequency of 120 to 150 kHz and a spring constant of 12 to 20 N/m, and measurement is carried out at a scanning frequency of 10.1 Hz in the DFM mode (Dynamic Force Mode). The measurement area is 80×80 μm.

In the present invention, the value Ry is more preferably 40 nm or less, and still more preferably 30 nm or less. Similarly, the value Ra is more preferably 3 nm or less, and still more preferably 1 nm or less.

[Conductive Fibers]

The conductive fibers in the present invention have conductivity, and have a form with a sufficiently long length, as compared with a diameter (thickness). It is thought that the conductive fibers in the present invention contact each other in the transparent conductive layer to form a three-dimensional conductive network, and function as an auxiliary electrode. Therefore, the conductive fibers having a longer length are preferred since they are advantageous to form a conductive network. On the other hand, when the conductive fibers become long, the conductive fibers are entangled to form an aggregate, which may deteriorate the optical property.

It is preferable to use conductive fibers with an optimal average aspect ratio (aspect ratio length/diameter) according to the conductive fibers to be used, since rigidity, the diameter or other properties of the conductive fibers may affect formation of the conductive network or aggregate. The average aspect ratio is preferably from 100 to 10,000, and more preferably from 100 to 1000.

In the invention, it is preferred that the conductive fibers have an average minor axis length of from 30 to less than 100 nm and an average major axis length of from 10 to less than 30 μm.

As a form of the conductive fibers, there are known several shapes such as hollow tubes, wires and fibers. For example, there are organic or inorganic fibers coated with metals, conductive metal oxide fibers, metal nanowires, carbon fibers and carbon nanotubes.

In the present invention, it is preferred that the thickness of the conductive fibers is 300 nm or less from a viewpoint of transparency. In addition, in order to satisfy conductivity of the conductive fibers, the conductive fibers are preferably at least one selected from the group consisting of metal nanowires and carbon nanotubes. Furthermore, silver nanowires can be most preferably used from a viewpoint of cost (material cost, production cost) and properties (electroconductivity, transparency and flexibility).

In the present invention, it is possible to determine the above average diameter and average aspect ratio of the conductive fibers as follows. A sufficient number of electron microscopic images are taken. Subsequently, each of the conductive fiber images is measured and the arithmetic average is obtained. The length of conductive fibers should fundamentally be determined in a stretched state to become a straight line. In reality, in most cases, they are curved. Consequently, by employing electron microscopic images, the projected diameter and projected area of each of the fibers were calculated employing an image analysis apparatus and calculation is carried out while assuming a cylindrical column (length=projected area/projected diameter). A relative standard deviation of the length or the diameter is represented with a value which is obtained by dividing the standard deviation of the measured values by the average of the measured values, and then multiplying the divided value by 100. The sample number of the conductive fibers to be measured is preferably at least 100, and more preferably at least 300.

Relative standard deviation (%)=(Standard deviation of measured values/average of measured values)×100

<Content Rate of Conductive Fibers>

In the invention, the content rate of conductive fibers implies a value obtained by subtracting the number of impurities from the number of the total particles (composed of conductive fibers with an aspect ratio of not less than 100 and impurities) in the transparent conductive layer, dividing the resulting value by the total particle number, and then multiplying the divided value by 100. Herein, the sample number of the conductive fibers to be measured is preferably at least 100, and more preferably at least 300.

As described above, the term "impurities" means particles remaining after the conductive fibers with an aspect ratio of not less than 100 are removed from the total particles contained in the transparent conductive layer. There are no limitations to material of the impurities. Organic or inorganic substances incorporated during formation of a transparent conductive layer or conductive fibers with an aspect ratio less than 100 incorporated during preparation of the conductive fibers are regarded as impurities which are factors impairing the layer smoothness.

In the invention, the content rate of the conductive fibers is not less than 99.00%, and preferably not less than 99.50%. That the content rate of the conductive fibers is not less than 99.50% is that the number of impurities is 5 or less of 500 of the conductive fibers to be measured.

<Metal Nanowires (Metal Fibers)>

Generally, metal nanowires indicate a linear structure composed of a metallic element as a main structural component. In particular, the metal nanowires in the present invention indicate a linear structure having a diameter of from an atomic scale to a nanometer size.

The metal nanowires applied to the conductive fibers in the present invention have an average length of preferably 3 μm or more, more preferably from 3 to 500 μm, and still more from 3 to 300 μm, in order to form metal nanowires each having a long conductive path. In addition, the relative standard deviation of the lengths of the conductive fibers is preferably 40% or less.

Moreover, a smaller average diameter of the nanoparticles is preferred from a viewpoint of transparency, while a larger average diameter of the nanoparticles is preferred from a viewpoint of conductivity. In the present invention, the average diameter of the metal nanowires is preferably from 10 to 300 nm and more preferably from 50 to 100 nm. In addition, the relative standard deviation of the diameters is preferably 20% or less.

The metal composition of the metal nanowires of the present invention is not specifically limited, and it can be composed of one or two or more kinds of metals of noble metal elements or base metal elements. It is preferred that the metal composition contains at least one kind of metal selected from the group consisting of noble metals (for example, gold, platinum, silver, palladium, rhodium, iridium, ruthenium and osmium), iron, cobalt, copper and tin. It is more preferred that the composition contains at least silver from a viewpoint of conductivity.

Moreover, for the purpose of achieving compatibility of conductivity and stability (sulfuration resistance and oxidation resistance of metal nanowire and migration resistance of metal nanowire), it is also preferred that it contains silver and at least one kind of metal belonging to the noble metal except silver. When the metal nanowires in the present invention contain two or more kinds of metallic elements, the metal composition may be different between the surface and the inside of the metal nanowires, and the whole of the metal nanowires may have the same metal composition. The deposition amount of the metal nanowires is preferably from 0.005 to 0.5 g/m$^2$, and more preferably from 0.01 to 0.2 g/m$^2$.

In the present invention, the production method of the metal nanowires is not specifically limited. The metal nanowires can be produced according to various methods such as a liquid phase method or a gas phase method. Typical production method of the metal nanowires is not specifically limited, and a conventional production method can be employed.

For example, the manufacturing method of Ag nanowires may be referred to Adv. Mater., 2002, 14, 833-837 and Chem. Mater., 2002, 14, 4736-4745; the manufacturing method of Au nanowires may be referred to JP-A No. 2006-233252; the manufacturing method of Cu nanowires may be referred to JP-A No. 2002-266007; and the manufacturing method of Co nanowires may be referred to JP-A No. 2004-149871. Specifically, the manufacturing methods of Ag nanowires as described in Adv. Mater. and Chem. Mater. can be preferably employed as a manufacturing method of the metal nanowires in the present invention, since they can simply manufacture Ag nanowires in an aqueous system and the electrical conductivity of silver is highest of all metals.

<Carbon Nanowires (the Same as Carbon Fibers)>

As nanowires employing carbon as a base material there are mentioned carbon nanotubes. Carbon nanotubes are composed of carbon fiber materials having a structure in which the graphite-like carbon atom surfaces (graphene sheets) with a thickness of several atomic layers is in the cylindrical form. The carbon nanotubes are divided roughly into a single layer nanotube (SWCNT) and a multilayer nanotube (MWCNT) due to the constitution number of the peripheral walls of the tubes. Further, they are divided into a chiral (spiral) type, a zigzag type, and an armchair type from the difference in the structure of the graphene sheet. Thus, there are known various types of carbon nanotubes.

As the carbon nanotubes applied to the conductive fiber in the present invention, any types of carbon nanotubes can be used, and these various carbon nanotubes may be used as an admixture of two or more kinds thereof. In the present invention, the carbon nanotubes are preferably single layer carbon nanotubes, which excel in electro-conductivity, and more preferably metallic armchair type single layer carbon nanotubes.

The carbon nanotubes in the present invention are preferably those with a large aspect ratio (aspect ratio=length/diameter), i.e., thin and long single layer carbon nanotubes, in order to form metal nanowires each nanoparticles having a long conductive path. As the carbon nanotubes, there are mentioned, for example, those having an aspect ratio of preferably 100 or more, and more preferably 1000 or more. The average length of the carbon nanotubes is preferably from 3 μm or more, more preferably 3 to 500 μm, and still more preferably from 3 to 300 μm. In addition, the relative standard deviation of the length is preferably 40% or less.

Moreover, the average diameter is preferably smaller than 100 nm, and more preferably from 30 to 50 nm. In addition, the relative standard deviation of the diameter is preferably 20% or less.

The production method of the carbon nanotubes used in the present invention is not specifically limited. There can be used well-known production methods, such as catalytic hydrogen reduction of carbon dioxide, an arc discharge method, a laser evaporation method, a CVD method, a gas phase growth method, and a HiPco method in which carbon monoxide is reacted with an iron catalyst at a high temperature and at a high pressure and to grow in a gas phase.

Moreover, carbon nanotubes are preferred in fully exhibiting various functions, which have been highly purified by various purifying methods such as a washing method, a centrifuge method, a filtration method, an oxidation method and chromatography, each method removing undesired reaction residues such as byproducts and metal catalysts.

(Transparent Conductive Material)

The transparent conductive material in the invention is a material in which when the material is formed into a film, the film exhibits transparency and uniform conductivity. As such a transparent conductive material, there are mentioned, for example, a conductive polymer, conductive metal oxide particles, metal particles, and organic or inorganic particles coated with metal. In the present invention, it is preferred from the viewpoint of transparency and conductivity that the conductive material is at least one selected from the group consisting of a conductive polymer and conductive metal oxide nanoparticles.

<Conductive Polymer>

Examples of the transparent conductive polymer employed for the conductive material in the present invention include compounds selected from the group consisting of the derivatives of each of polypyrrole, polyaniline, polythiophene, polythienylene vinylene, polyazulene, polyisothianaphthene, polycarbazole, polyacetylene, polyphenylene, polyphenylene vinylene, polyacene, polyphenyl acetylene, polydiacetylene and polynaphthalene.

When the conductive materials in the present invention are employed, only one type of the conductive polymer may be employed alone or at least two types of the conductive polymers may be employed in combination. It is preferred in view of electrical conductivity and transparency that at least one compound selected from the group consisting of polyaniline having a repeated unit represented by the following Formula (I) or (II) and its derivatives, polypyrrole derivatives having a repeated unit represented by the following Formula and polythiophene derivatives having a repeated unit represented by the following Formula (IV) is employed.

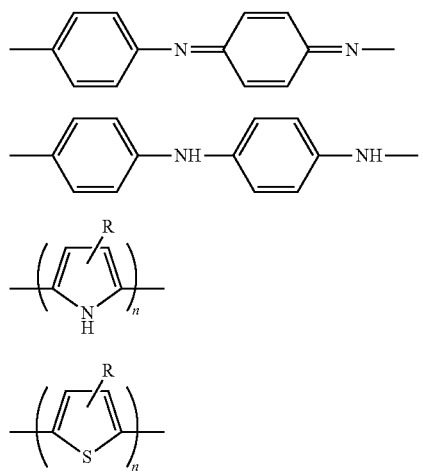

Formula (I)

Formula (II)

Formula (III)

Formula (IV)

In Formula (III) and Formula (IV) above, R is primarily a linear organic substituent, which is preferably an alkyl group, an alkoxy group, or an allyl group or a combination thereof. Further, these may be combined with a sulfonate group, an ester group, or an amido group or a combination thereof; as long as properties as a soluble conductive polymer are not impaired. In the formulae, n is an integer.

The conductive polymer in the invention may be subjected to doping treatment to further enhance electro-conductivity. Examples of a dopant used for the conductive polymer include at least one selected from the group consisting of sulfonic acids (hereinafter also referred to as "long chain sulfonic acids") having a hydrocarbon group with 6 to 30 carbon atoms or polymers thereof (for example, polystyrene sulfonic acid), halogen atoms, Lewis acids, protonic acids, transition metal halides, transition metal compounds, alkaline metals, alkaline earth metals, $MClO_4$ ($M=Li^+$ or $Na^+$), $R_4N^+$ ($R=CH_3$, $C_4H_9$, or $C_6H_5$) and $R_4P^+$ ($R=CH_3$, $C_4H_9$, or $C_6H_5$). Of these, the above long chain sulfonic acids are preferred.

Further, the dopants used for the conductive polymer may be incorporated into fullerenes such as hydrogenated fullerene hydride, fullerene hydroxide and fullerene sulfonic acid. In the transparent conductive layer, the content of the above dopants is preferably not less than 0.001 parts by mass, and more preferably from not less than 0.5 parts by mass, based on 100 parts by mass of the conductive polymer.

The transparent conductive materials in the invention may incorporate both fullerenes and at least one dopant selected from the group consisting of a long chain sulfonic acid, polymers of the long chain sulfonic acid (for example, polystyrene sulfonic acid), halogens, Lewis acids, protonic acids, transition metal halides, transition metal compounds, alkaline metals, alkaline earth metals, $MClO_4$, $R_4N^+$ and $R_4P^+$.

As the conductive polymer in the invention, employed may be conductive polymers modified with metals, disclosed in Japanese Unexamined Patent Application Publication (Translation of PCT Application) No. 2001-511581, and Japanese Patent O.P.I. Publication Nos. 2004-99640 and 2007-165199.

The transparent conductive material in the invention including the conductive polymer may contain a water soluble organic compound. A water soluble organic compound is known, which is added to the conductive polymer to exhibit an electro-conductivity improving effect, and it is occasionally called a $2^{nd}$ dopant (or a sensitizer). The $2^{nd}$ dopant employed in the transparent conductive material in the present invention is not specifically limited, and can be appropriately selected from among those known in the art. Preferred examples thereof include an oxygen-containing compound such as dimethyl sulfoxide (DMSO) or diethylene glycol.

In the transparent conductive material in the invention including the conductive polymer, the content of the above-described $2^{nd}$ dopant is preferably not less than 0.001 parts by mass, more preferably from 0.01 to 50 parts by mass and still more preferably from 0.01 to 10 parts by mass, based on 100 parts by mass of the conductive polymer.

The transparent conductive material in the invention including the conductive polymer may contain a transparent resin component and additives, in addition to the above-described conductive polymer, in order to secure film forming properties and film strength. The transparent resin component is not specifically limited as long as it is compatible with the conductive polymer, or mixed and dispersed in the conductive polymer, and may be a thermally curable resin or a thermoplastic resin.

Examples of the transparent resin include polyester resin (e.g., polyethylene terephthalate, polybutylene terephthalate or polyethylene naphthalate); polyimide resin (e.g., polyimide resin or polyamideimide resin); polyamide resin (e.g., polyamide 6, polyamide 6,6, polyamide 12 or polyamide 11); fluororesin (e.g., polyvinylidene fluoride, polyvinyl fluoride, polytetrafluoroethylene, ethylene-tetrafluoroethylene copolymer, polychlorotrifluoroethylene); vinyl resin (e.g., polyvinyl alcohol, polyvinyl ether, polyvinyl butyral, polyvinyl acetate or polyvinyl chloride); epoxy resin; xylene resin; aramid resin; polyurethane resin; polyurea resin; melamine resin; phenol resin; polyether, acrylic resin; and a copolymer thereof

[Filter Having a Surface Filtration Mechanism]

The filter having a surface filtration mechanism means one in which suspended substances or floating substances in a fluid are captured mainly on the surface of the filter. Generally, most filters being viewed from above, through-pores are observed in the filters. In the invention, the filter having a surface filtration mechanism is defined as a filter in which when the filter is viewed from above through a microscope, through-pores are observed. Examples thereof include a filter in the mesh form in which fine threads made of polyesters and the like are weaved according to a weaving method such as plain weave, twill weave or satin weave and a nuclepore membrane filter whose pores are made by electron beams.

A circle converted average pore diameter of the filter having a surface filtration mechanism is a diameter of a circle having the same area as the pore of the filter observed by an electron microscope. Hitherto, a method is unclear which separates nanowires with an aspect ratio of not less than 100 and particles with a circle converted diameter larger than the minor axis length of the nanowires and smaller than the major axis length of the nanowires. Filtration according to a conventional depth filter cannot be practically applied.

When filtration is carried out employing a filter having a surface filtration mechanism with a circle converted average pore diameter larger than the minor axis length of nanowires and smaller than the major axis length of nanowires, the nanowires pass through the filter paper, whereby particles with a sectional area larger than a circle converted average diameter can be separated. This is one of technical characteristics of the invention.

Of filters having a surface filtration mechanism, a filter in the mesh form is preferred, which enables rapid filtration in a conventional dead-end filtration. When a conventional dead-end filtration is applied, a nuclepore membrane filter causes clogging of the filter paper, and requires that filtration is carried out while the mother liquid in the vicinity of the filter surface being stirred, as in cross-flow filtration or rotation disc filtration, which is undesired.

With regard to the membrane filtration process, reference is made to literature 1 "Powder and Industry, Vol. 40, No. 8, P 44". Examples of a filter used in the membrane filtration process include a polyester mesh with a pore size of 1 μm (produced by Clever Co., Ltd.).

[Filter Having a Depth Filtration Mechanism]

The filter having a depth filtration mechanism means one in which suspended substances or floating substances in a fluid are captured not only on the surface of the filter but also at the inside of the filter. Generally, most filters being viewed from above, through-pores are not observed in the filters. In the invention, the filter having a depth filtration mechanism is defined as a filter in which when the filter is viewed from above through a microscope, through-pores are not observed.

Examples thereof include a general quantitative filter paper (such as those described in Advantec Catalogue 2009-2010, page 864), a membrane filter made of cellulose acetate material (for example, those described in Advantec Catalogue 2009-2010, page 746) and a ceramic film having a monolith structure (for example, produced by Nippon Gaishi Co., Ltd.).

When filtration is carried out employing a filter having a depth filtration mechanism with a filtration pore diameter larger than the minor axis length of nanowires and smaller than the major axis length of nanowires, the nanowires do not pass through the filter paper, and particles with a circle converted average diameter smaller than the filtration diameter pass through the filter paper, thereby separating the nanowires from the particles with a size smaller than the filtration diameter.

When a dead-end filtration of nanowires is applied in the membrane filtration process, the membrane filter rapidly clogs. It is preferred that the filtration is carried out while the mother liquid in the vicinity of the filter surface being stirred, as in cross-flow filtration or rotation disc filtration.

When nanowires, being separated from minute particles according to a conventional dead-end filtration, are captured and piled on the membrane surface, aggregation occurs, which makes re-dispersion of the nanowires difficult.

In the invention, the nominal filtration diameter is defined as a diameter of latex particles captured in an amount of 99.5% in a filter when mono-dispersed latex particles with a specific particle diameter are filtered.

An appropriate combination of a filter having a surface filtration mechanism and a filter having a depth filtration mechanism makes it possible to effectively separate nanowires from impurities with a size different from the nanowires.

[Manufacturing Method of Transparent Electrode]

The manufacturing method of the transparent electrode of the invention is not specifically limited. As the method, preferred is a method (hereinafter referred to as a transfer method) in which after forming a transparent conductive layer containing conductive fibers and a transparent conductive material on the releasing surface of a smooth releasing substrate, the resulting transparent conductive layer is transferred onto a transparent substrate so as to form a transparent electrode or a method in which a transparent conductive layer containing conductive fibers and a transparent conductive material is coated on a transparent substrate to form a transparent electrode.

As a releasing substrate employed in the manufacturing method of a transparent electrode according to a lamination process, a resin substrate and a resin film are suitably employed. The above resins are not specifically limited, and can be appropriately selected from those known in the art. For example, appropriately employed are substrates and films, which are composed of a single layer or a plurality of layers composed of a synthetic resin such as a polyethylene terephthalate resin, a vinyl chloride resin, an acrylic resin, a polycarbonate resin, a polyimide resin, a polyethylene resin or a polypropylene resin. Further employed may be a glass substrate and a metal substrate. Further, if desired, the surface (the releasing surface) of the releasing substrate may be subjected to surface treatment via application of a releasing agent such as a silicone resin, a fluorine-containing resin or a wax.

The surface of the releasing substrate preferably has high smoothness, since it affects the smoothness of the surface after transfer of a transparent conductive layer. Specifically, Ry of the releasing substrate is preferably from 1 to 50 nm, more preferably not more than 40 nm, and still more preferably not more than 30 nm. Moreover, the releasing substrate has Ra of preferably not more than 5 nm, more preferably not more than 3 nm, and still more preferably not more than 1 nm.

There is no restriction in particular to the method of forming a transparent conductive layer containing an auxiliary electrode composed of conductive fibers and a transparent conductive material on the releasing surface of a releasing substrate. However, in the formation of the transparent conductive layer, a liquid phase film forming method such as a coating method or a printing method is preferably employed in view of productivity, electrode qualities such as smoothness and uniformity, and reduction of environmental load.

As the coating method employed may be a roller coating method, a bar coating method, a dip coating method, a spin coating method, a casting method, a die coating method, a blade coating method, a bar coating method, a gravure coating method, a curtain coating method, a spray coating method, or a doctor coating method, while as the printing method employed may be a letterpress (typographic) printing method, a porous (screen) printing method, a lithographic (offset) printing method, an intaglio (gravure) printing, a spray printing method, and an ink-jet printing method.

As preliminary treatment to enhance close contact and coatability, if desired, the surface of the releasing substrate may be subjected to physical surface treatment such as corona discharge treatment or plasma discharge treatment.

As a typical method of forming the transparent conductive layer with excellent surface smoothness containing conductive fibers and a transparent conductive material on a transparent substrate, for example, the following processes are mentioned.

On the releasing surface of the releasing substrate, a conductive network structure made of conductive fibers is formed by applying (or printing) a dispersion solution containing conductive fibers, followed by drying. Subsequently, a dispersion solution of a transparent conductive material is applied (or printed) on the network structure of the conductive fibers, so that the conductive material permeates in the gaps in the network structures of the conductive fibers on the substrate surface, thereby forming a transparent conductive layer containing the conductive fibers and the conductive material. Subsequently, an adhesion layer is applied on the transparent conductive layer or on another transparent substrate, and both the transparent conductive layer and the transparent substrate are adhered to each other through the adhesion layer. After the adhesion layer is cured and the releasing substrate is peeled, the transparent conductive layer is transferred to the transparent substrate.

This process can provide a transparent conductive layer with excellent conductivity, since the network structure of the conductive fibers is arranged in three dimensions in the transparent conductive material layer, and the contact area of the conductive fibers and the transparent conductive material increases, whereby the auxiliary electrode function of the conductive fibers can be fully utilized.

In the above-mentioned process, it is effective as a method of increasing the conductivity of the network structure of the conductive fibers that the conductive fibers formed after application and drying is subjected to calendar treatment or heat treatment so as to improve the adhesion between the conductive fibers or to plasma treatment so as to reduce the contact resistance between the conductive fibers. Moreover, in the above-mentioned process, the releasing surface of the releasing substrate may be subjected to hydrophilization treatment such as corona discharge (plasma) treatment.

In the above process, the adhesive agent may be applied onto the releasing substrate side or onto the transparent substrate side. The adhesive agent is not specifically limited as long as it is transparent in the visible region and has transfer ability. The adhesive agent may be a curable resin or a thermoplastic resin as long as it is transparent. Examples of the curable resin include a heat curable resin, an UV curable resin and an electron beam curable resin. Among these curable resins, a UV curable resin is preferably used, since it excels in working property, and a resin curing equipment used is simple.

A UV curable resin is a resin which is to be hardened through a cross linkage reaction by UV irradiation, and one comprising a monomer which has an ethylenic unsaturated double bond is preferably used. Examples of the UV curable resin include an acrylic urethane resin, a polyester acrylate resin, an epoxy acrylate resin and a polyol acrylate resin. In the present invention, a UV curable resin of acrylic type or acrylic urethane type is preferably used as a main component of a binder.

The acrylic urethane resin can be easily obtained by reacting a polyester polyol with an isocyanate monomer or its prepolymer and then reacting the resulting product with an acrylate having a hydroxy group such as 2-hydroxyethyl acrylate, 2-hydroxyethyl methacrylate (hereinafter, the acrylate comprises methacrylate) or 2-hydroxypropyl acrylate. For example, the compound described in Japanese Patent O.P.I. Publication No. 59-151110 can be used. More specifically, the mixture of 100 parts of UNIDIC 17-806 (made by DIC Co., Ltd.) and 1 part of COLONATE L (made by Nippon Polyurethane Industry Co., Ltd.) is preferably used.

As an example of the UV curable polyester acrylate resin, there is mentioned a compound which is easily obtained by reacting a polyester polyol with a monomer such as 2-hydroxyethyl acrylate or 2-hydroxypropyl acrylate. The compound described in Japanese Patent O.P.I. Publication No. 59-151112 can be used.

As an example of the UV curable epoxy acrylate resin, there is mentioned a compound which is obtained by reacting an epoxy acrylate oligomer in the presence of a reactive diluting agent and a photoinitiator. The compound described in Japanese Patent O.P.I. Publication No. 1-105738 can be used.

Examples of the UV curable polyol polyacrylate resin include trimethylolpropane triacrylate, ditrimethylolpropane tetraacrylate, pentaerythritol triacrylate, pentaerythritol tetraacrylate, dipentaerythritol hexaacrylate and alkyl modified dipentaerythritol pentaacrylate.

The polymerizable monomers having one unsaturated double bond in the molecule include methyl acrylate, ethyl acrylate, butyl acrylate, vinyl acetate, benzyl acrylate, cyclohexyl acrylate, and styrene. The polymerizable monomers having two unsaturated double bonds in the molecule include ethylene glycol diacrylate, propylene glycol diacrylate, divinylbenzene, 1,4-cyclohexane diacrylate, 1,4-cyclohexyldimethyl diacrylate, trimethylol propane triacrylate, and pentaerythritol tetraacrylate.

Among these, an acrylic actinic-ray curable resin is preferred as a main component for a binder, which is selected from 1,4-cyclohexane diacrylate, pentaerythritol tetra(meth)acrylate, pentaerythritol tri(meth)acrylate, trimethylolpropane(meth)acrylate, trimethylolethane(meth)acrylate, dipentaerythritol tetra(meth)acrylate, dipentaerythritol penta(meth)acrylate, dipentaerythritol hexa(meth)acrylate, 1,2,3-cyclohexane tetramethacrylate, polyurethane polyacrylate and polyester polyacrylate.

As a photoinitiator for these UV curable resins, there are mentioned benzoin or its derivatives; and acetophenone, benzophenone, hydroxybenzophenone, Michler's ketone, $\alpha$-amyloxim ester, thioxanthone and their derivatives. The photoinitiator may be used with a photosensitizer. The above-mentioned photoinitiator can also be used as a photosensitizer.

Moreover, sensitizers such as n-butylamine, triethylamine and tri-n-butylphosphine can be used when the photoinitiator of an epoxy acrylate is employed. The amount of the photoinitiator or the photosensitizer used in a UV curable resin composition is 0.1 to 15 parts by mass, and preferably from 1 to 10 parts by mass, based on 100 parts by mass of the composition.

After a releasing substrate on which a transparent conductive layer is pasted on a transparent substrate and subjected UV irradiation to cure the adhesive agent, the releasing substrate is separated from the resulting material to obtain the transparent conductive layer transferred to the transparent substrate side. Herein, the adhesion method is not specifically limited. A sheet press machine or a roll press machine can be used for adhesion, and a roll press machine is preferably used. The roll press machine is suitably used since it can give pressure uniformly and manufacturing efficiency better than the sheet press machine.

[Patterning]

The transparent electrode in the present invention can be patterned. There is no restriction in particular to the method and process of patterning, and a well-known approach can be appropriately applied. For example, a patterned transparent conductive layer being formed on the releasing surface and then transferred onto a transparent substrate, the patterned transparent electrode can be obtained. Specifically, the following methods can be preferably used.

i) A method in which the transparent conductive layer in the invention is directly formed in the form of pattern on a releasing substrate by using a printing method.

ii) A method in which the transparent conductive layer in the invention is uniformly formed on a releasing substrate, followed by carrying out patterning employing a conventional photolithographic process.

iii) A method in which the transparent conductive layer in the invention is uniformly formed on a releasing substrate employing a transparent conductive material containing a UV curable resin, followed by carrying out patterning according to a photolithographic process.

iv) A method in which the transparent conductive layer in the invention is uniformly formed on a photoresist negative pattern which has been provided on a releasing substrate, followed by carrying out patterning according to a lift off method.

By using any one of the above-mentioned methods, the patterned transparent conductive layer formed on a releasing substrate is transferred to a transparent substrate, whereby the transparent electrode of the invention, which has been patterned, can be formed.

[Preferred Application]

The transparent electrode of the invention has high conductivity and transparency, and can be suitably employed in the field of various optoelectronic devices such as a liquid crystal display elements, an organic electroluminescence element, an inorganic electroluminescence element, an electronic paper, an organic solar cells and an inorganic solar cells; an electromagnetic wave shield; and a touch panel. Among them, it can be especially preferably employed for an organic electroluminescence element, in which the surface smoothness is severely required, or as a transparent electrode for an organic thin film solar battery element.

<<Organic EL Element)

Preferred examples of the layer constitution of the organic EL element of the invention will be shown below, but the invention is not limited thereto.

(i) Anode/Light emission layer unit/Electron transporting layer/Cathode
(ii) Anode/Hole transporting layer/Light emission layer unit/ Electron transporting layer/Cathode
(iii) Anode/Hole transporting layer/Light emission layer unit/ Hole blocking layer/Electron transporting layer/Cathode
(iv) Anode/Hole transporting layer/Light emission layer unit/ Hole blocking layer/Electron transporting layer/Cathode buffering layer/Cathode
(v) Anode/Anode buffering layer/Hole transporting layer/ Light emission layer unit/Hole blocking layer/Electron transporting layer/Cathode buffering layer/Cathode <<Light Emission Layer>>

The light emission layer in the invention is a layer where electrons and holes, injected from electrodes, an electron transporting layer or a hole transporting layer, are recombined to emit light. The portions where light emits may be in the light emission layer or at the interface between the light emission layer and the layer adjacent thereto.

The total thickness of the light emission layer or layers is not particularly limited. In view of improving layer uniformity and stability of emitted light color against driving electric current without requiring unnecessary high voltage on light emission, the above thickness is adjusted to be in the range of preferably from 2 to 200 nm, and more preferably from 5 to 40 nm. Further, the thickness of each of the light emission layers is adjusted to be in the range of preferably from 2 to 100 nm, and more preferably from 5 to 30 nm.

Employing an emission dopant or a host compound each described later, the light emission layer is formed according to a known thin layer formation method such as a vacuum deposition method, a spin coat method, a casting method, an LB method, or an ink jet method.

(Host Compound)

The host compound or emission dopant contained in the light emission layer will be explained below.

The host compound, which is contained in the light emission layer of the organic EL element of the invention, is a compound having a phosphorescence quantum yield at room temperature (25° C.) of preferably less than 0.1, and more preferably less than 0.01. The content of the host compound in the light emission layer is preferably not less than 20% by mass.

Known host compounds may be used singly or as an admixture of plural kinds thereof. Usage of plural host compounds can adjust charge transfer, and obtain an organic EL element with high efficiency.

The host compound used in the invention is not specifically limited in the chemical structure. Typical examples thereof include compounds having fundamental skeletons such as carbazole derivatives, triarylamine derivatives, aromatic borane derivatives, nitrogen-containing heterocyclic compounds, thiophene derivatives, furan derivatives and oligoarylene compounds; carboline derivatives; and diazacarbazole derivatives (herein, the diazacarbazole derivatives mean compounds in which at least one carbon atom in the hydrocarbon ring constituting the carboline ring in carboline derivatives is substituted with a nitrogen atom.).

The host compound used in the invention may be a low molecular weight compound, a polymeric compound having a repeating unit or a low molecular weight compound (evaporation-polymerizable emission host) with a polymerizable group such as a vinyl group or an epoxy group.

The host compound is preferably a compound with high Tg (glass transition temperature), which has a hole and electron transporting ability and prevents the emission wavelength shifting to longer wavelength.

In the invention, the host compounds may be used as an admixture of two or more kinds thereof. Usage of two or more kinds of the host compounds can adjust charge transfer, and obtain an organic EL element with high efficiency. Further, usage of two or more kinds of emission dopants can mix light with a different color, and can emit light with any color. Selection of kinds of the emission dopants or adjustment of their doping amount enables white light emission, which can be applied to an illumination or a back light.

Typical examples of the conventional host compound include those described in the following Documents.

For example, JP-A Nos. 2001-257076, 2002-308855, 2001-313179, 2002-319491, 2001-357977, 2002-334786, 2002-8860, 2002-334787, 2002-15871, 2002-334788, 200243056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

In the invention, the host compound contained in each of the light emission layers may be different. However, it is preferred in obtaining a long driving lifetime that 30% by mass or more of a host compound contained in each of a first light emission layer containing two or more kinds of emission dopants having a different emission wavelength and a second light emission layer emitting a shorter wavelength light which is located closer to a cathode than the first light emission layer are the same compound. More preferably 50% by mass or more of the host compound are the same compound, and most preferably all of the host compound are the same compound.

Among the host compounds described above, a host compound having the lowest excitation triplet energy (T1) higher than 2.7 Ev is preferred in view of higher emission efficiency. The lowest excitation triplet energy in the invention refers to a peak energy of the emission band corresponding to transition between the lowest vibration bands in the phosphorescence emission spectra of a host compound solution observed at a liquid nitrogen temperature, in which the host compound is dissolved in a solvent.

In the organic EL element of the invention, the host compound transfers a carrier, and therefore, the host compound is preferably a material having a carrier transport ability. Carrier mobility is used as a physical property representing carrier transport ability. Carrier mobility of an organic material is generally dependent on electric field intensity. Material having a high dependency on electric field intensity is likely to impair the balance of injection and transport of holes and electrons. The host compound is preferably a material having a low dependency of carrier mobility on electric field intensity.

(Emission Dopant)

Next, the emission dopant in the invention will be explained.

A phosphorescence emission dopant is preferably employed as the emission dopant in the invention.

The phosphorescence emission dopant in the invention is a compound which emits light from the excited triplet, can emit phosphorescence at room temperature (25° C.), and has a phosphorescent quantum yield at 25° C. of not less than 0.01. The phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The phosphorescence emission dopant in the invention is a compound, in which the phosphorescent quantum yield measured employing any one of the solvents satisfies the above-described definition (not less than 0.01).

The light emission of the phosphorescence emission dopant is divided in two types in principle, one is an energy transfer type in which recombination of a carrier occurs on the host to which the carrier is transported to excite the host, the resulting energy is transferred to the phosphorescence emission dopant, and light is emitted from the phosphorescence emission dopant, and the other is a carrier trap type in which recombination of a carrier occurs on the phosphorescence emission dopant, a carrier trap material, and light is emitted from the phosphorescence emission dopant. However, in each type, it is necessary that energy level of the phosphorescence emission dopant in excited state is lower than that of the host compound in excited state.

The phosphorescence emission dopant is suitably selected from those used in the light emission layer of an organic EL element.

The phosphorescence emission dopant in the invention is preferably a metal complex containing a metal belonging to a group VIII of the periodic table as a center metal, and is more preferably an iridium compound, an osmium compound, a platinum compound (a platinum complex) or a rare earth compound, and most preferably an iridium compound.

[Injecting Layer: Electron Injecting Layer, Hole Injecting Layer]

The injecting layer is optionally provided, and may be provided between the anode and the light emission layer or hole transporting layer, and between the cathode and the light emission layer or the electron transporting layer.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc. Further, a material disclosed in Japanese Unexamined Patent Application Publication (Translation of PCT Application) No. 2003-519432 is preferably employed.

The cathode buffer layer (electron injecting layer) is described in Japanese Patent O.P.I. Publication Nos. 6-325871, 9-17574, and 10-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 nm to 5 □m depending on kinds of the material used.

[Inhibiting Layer: Hole Inhibiting Layer, Electron Inhibiting Layer]

The inhibiting layer is a layer provided if necessary in addition to the fundamental constituent layer as described above, and is for example a hole inhibiting layer as described in Japanese Patent O.P.I. Publication Nos. 11-204258, and 11-204359, and on page 237 of "Organic EL element and its frontier of industrialization" (published by NTS Corporation, Nov. 30, 1998).

The hole inhibiting layer is an electron transporting layer in a broad sense, and is comprised of material having an ability of transporting electrons but an extremely poor ability of holes, which can increase a recombination probability of electrons and holes by transporting electrons and blocking holes. Further, the constitution of an electron transporting layer described later can be used in the hole inhibiting layer as necessary.

The hole inhibiting layer in the organic EL element of the invention is preferably provided to be in contact with a light emission layer.

On the other hand, the electron blocking layer is an hole transporting layer in a broad sense, and is comprised of material having an ability of transporting holes but an extremely poor ability of electrons, which can increase a recombination probability of electrons and holes by transporting holes and blocking electrons.

The thickness of the hole inhibiting layer or electron transporting layer is preferably from 3 to 100 nm, and more preferably from 5 to 30 nm.

[Hole Transporting Layer]

The hole transporting layer is comprised of a hole transporting material having an ability of transporting holes, and a hole injecting layer and an electron blocking layer are included in the hole transporting layer in a broad sense. The hole transporting layer may be a single layer or plural layers.

The hole transporting material has a hole injecting ability, a hole transporting ability or an ability to form a barrier to electrons, and may be either an organic substance or an inorganic substance. Examples of thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer.

As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-trip-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4''-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-type-Si and p-type-SiC are usable.

So-called p-type hole transporting materials as disclosed in Japanese Patent O.P.I. Publication Nos. 4-297076, 2000-196140 and 2001-102175, and in J. Appl. Phys., 95, 5773 (2004), Japanese Patent O.P.I. Publication No. 11-251067, J. Huang et al., Applied Physics Letters 80 (2002), p. 139, and Japanese Unexamined Patent Application Publication (Translation of PCT Application) No. 2003-519432 are also applicable. In the present invention, these materials are preferably utilized since an emitting device exhibiting a higher efficiency is obtained.

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 nm to 5 μm, and preferably from 5 to 200 nm. The hole transporting layer may be composed of a single layer structure comprising one or two or more of the materials mentioned above.

[Electron Transporting Layer]

The electron transporting layer comprises a material (an electron transporting material) having an electron transporting ability, and in a broad sense refers to an electron injecting layer or a hole blocking layer. The electron transporting layer can be provided as a single layer or plural layers.

An electron transporting material (which serves also as a hole inhibiting material) used in a single electron transporting layer or in the electron transporting layer closest to the cathode in plural electron transporting layers has a function of incorporating electrons injected from a cathode to a light emission layer, and is selected from known compounds. Examples thereof include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material. A polymer in which the material mentioned above is introduced in the polymer side chain or a polymer having the material as the polymer main chain can be also used.

A metal complex of an 8-quinolynol derivative such as aluminum tris-(8-quinolynol) (Alq$_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) (Znq), and a metal complex formed by replacing the central metal of the foregoing complexes with another metal atom such as In, Mg, Cu, Ca, Sn, Ga or Pb can be used as the electron transporting material.

Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n-type-Si and n-type-SiC may also be used as the electron transporting material in a similar way as in the hole transporting layer.

The electron transporting layer can be formed employing the above-described electron transporting materials and a known method such as a vacuum deposition method, a spin coat method, a casting method, a printing method including an ink jet method or an LB method. The thickness of electron transporting layer is not specifically limited, but is ordinarily from 5 nm to 5 μm, and preferably from 5 to 200 nm. The electron transporting layer may be composed of a single layer comprising one or two or more of the electron transporting material.

An electron transporting layer having high n-type property doped with impurity can be utilized. Examples thereof include those described in Japanese Patent O.P.I. Publication Nos. 4-297076, 10-270172, 2000-196140, and 2001-102175, and J. Appl. Phys., 95, 5773 (2004) and so on.

It is preferable in the invention to employ such an electron transport layer regarded as having high n-type property, since an element with lower power consumption can be prepared.

[Substrate]

The substrate (also referred to as a base body, a base plate, a base material or a support) employed for the organic EL element of the invention is not restricted to specific kinds of materials such as glass and plastic, and may be transparent or opaque. When light is taken out from the substrate side, the substrate is preferably transparent. Examples of the transparent substrate preferably used include glass, quartz and a light transmissible plastic film. Especially preferred one is a resin film capable of providing flexibility to the organic EL element.

Examples of materials for the resin film include polyesters such as polyethylene terephthalate (PET) and polyethylene naphthalate (PEN), polyethylene, polypropylene, cellophane, cellulose esters and their derivatives such as cellulose diacetate, cellulose diacetate, cellulose acetate butylate, cellulose acetate propionate (CAP), cellulose acetate phthalate (TAC), and cellulose nitrate, polyvinylidene chloride, polyvinylalcohol, polyethylenevinylalcohol, syndiotactic polystyrene, polycarbonate, norbornane resin, polymethylpentene, polyetherketone, polyimide, polyether sulfone (PES), polyphenylene sulfide, polysulfones, polyether imide, polyetherketone imide, polyamide, fluorine resin, nylon, polymethyl methacrylate, acryl or polyarylates, and cyclo-olefin resins such as ARTON (commercial name, manufactured by JSR Corp.) or APEL (commercial name, manufactured by Mitsui Chemicals Inc.).

On the surface of the resin film, a cover film comprising an inorganic or organic substance or a hybrid cover film comprising the both may be formed, and the cover film is preferably one with a barrier ability having a vapor permeability of not more than 0.01 $g/m^2$-day-atm measured by a method stipulated by JIS K 7129-1992, and more preferably one with a high barrier ability having an oxygen permeability of not more than $10^{-3}$ $g/m^2$/day as well as a vapor permeability of not more than $10^{-3}$ $g/m^2$-day, measured by a method stipulated by JIS K 7126-1992. It is further more preferred that the vapor permeability and the oxygen permeability both are not more than $10^{-5}$ $g/m^2$/day.

Any materials capable of preventing penetration of substance such as moisture and oxygen causing degradation of the device are usable for forming the barrier film, and for example, silicon oxide, silicon dioxide and silicon nitride are usable. It is more preferred that the barrier film has a multi-laminated layer structure composed of a layer of the inorganic material and a layer of an organic material for improving fragility of the film. It is preferable that the both layers are alternatively laminated for several times though there is no limitation as to the laminating order of the inorganic layer and the organic layer.

The method for forming the barrier film is not specifically limited and, for example, a vacuum deposition method, a spattering method, a reaction spattering method, a molecule beam epitaxy method, a cluster-ion beam method, an ion plating method, a plasma polymerization method, an atmospheric pressure plasma polymerization method, a plasma CVD method, a laser CVD method, a heat CVD method and a coating method are applicable, and the atmospheric pressure plasma polymerization method as described in Japanese Patent O.P.I. Publication No. 2004-68143 is especially preferred.

As the opaque substrate, for example, a plate or film of a metal such as aluminum or stainless steel, an opaque resin substrate and a ceramic substrate are cited.

[Sealing]

As the sealing means used for sealing the organic EL element of the invention, a method for adhering a sealing material to the electrodes and the substrate by an adhesive agent is applicable.

The sealing material is placed so as to cover the displaying area of the organic EL element and may have a flat plate shape or a concave plate shape, and the transparency and the electric insulation property thereof are not specifically limited.

Typical examples of the sealing material include a glass plate, a polymer plate, a polymer film, a metal plate and a metal film. As the glass plate, there is mentioned a plate of soda-lime glass, barium strontium-containing glass, lead glass, alumina silicate glass, boron silicate glass or quartz. As the polymer plate, there is mentioned a plate of polycarbonate, acryl resin, polyethylene terephthalate, polyether sulfide or polysulfone. As the metal plate, there is mentioned a plate composed of one or more kinds of metal selected from stainless steel, iron, copper, aluminum, magnesium, nickel, zinc, chromium, titanium, molybdenum, silicon, germanium, tantalum and an alloy thereof.

In the invention, the polymer film or the metal film is preferably used, since it can provide a thin organic EL element. The polymer film is preferably one having an oxygen permeability of not more than $10^{-3}$ $g/m^2$/day, and a vapor permeability of not more than $10^{-3}$ $g/m^2$/day, and more preferably one having a vapor permeability of not more than $10^{-5}$ $g/m^2$/day and an oxygen permeability of not more than $10^{-5}$ $g/m^2$/day.

For preparing the sealing material in the concave form, a sandblast treatment and a chemical etching treatment are applicable. As the adhesive agent, a photo-curable and thereto-curable adhesive agent containing a reactive vinyl group of acryl type oligomer and a methacryl type oligomer, and a moisture curable adhesive agent such as 2-cyanoacrylate can be cited. Epoxy type thermally and chemically (two liquid type) curable adhesive agents are applicable. Hot-melt type polyamide, polyester and polyolefin adhesive agents are applicable. A cationic curable type UV curable epoxy adhesive agent is also usable.

The organic EL element is degraded by heat treatment in some cases, and therefore, the adhesive agent capable of being cured to adhere within the temperature range of from room temperature to 80° C. is preferred. A moisture absorbing agent may be dispersed in the adhesive agent. Coating of the adhesive agent onto the adhering portion may be performed by a dispenser available on the market or printing such as screen printing.

It is preferred that a layer comprising an inorganic or organic material is provided on outside of the electrode placed on the side of facing to the substrate through an organic layer so as to cover the electrode and the organic layer and contact with the substrate to form a sealing layer. In this case, a material for forming the sealing layer may be a material having a function to inhibit permeation of a substance such as water and oxygen causing degradation of the element, and for example, silicon oxide, silicon dioxide and silicon nitride are usable. The sealing layer preferably has a multi-laminated layer structure composed of a layer of the inorganic material and a layer of an organic material for improving fragility of the layer.

The method for forming the layer is not specifically limited and, for example, a vacuum deposition method, a spattering method, a reaction spattering method, a molecule beam epitaxy method, a cluster-ion beam method, an ion plating method, a plasma polymerization method, an atmospheric pressure plasma polymerization method, a plasma CVD method, a laser CVD method, a heat CVD method and a coating method are applicable.

In the space between in the sealing material and the displaying portion of the organic EL Device, an inactive gas such as nitrogen or argon or an inactive liquid such as fluorinated hydrocarbon or silicone oil is preferably injected in the form of gas or liquid phase. The space can be made vacuum. A hygroscopic compound can be enclosed inside.

Examples of the hygroscopic compound include a metal oxide such as sodium oxide, potassium oxide, calcium oxide, barium oxide, magnesium oxide or aluminum oxide; a sulfate such as sodium sulfate, calcium sulfate, magnesium sulfate or cobalt sulfate; a metal halide such as calcium chloride, magnesium chloride, cesium fluoride, tantalum fluoride, cerium bromide, magnesium bromide, barium iodide or magnesium iodide; and a perchlorate such as barium perchlorate or magnesium perchlorate. Regarding the sulfate, metal halide and perchlorate, their anhydride is suitably employed.

[Protection Layer and Protection Plate]

A protection layer or a protection plate may be provided on outside of the sealing layer of the side facing to the substrate through the organic layer or the outside of the sealing film for raising the mechanical strength of the element. Such a protection layer or plate is preferably provided since strength of the element is not so high even when sealing is carried out by the foregoing sealing layer. As materials for the protection layer or plate, the same glass plate, polymer plate or film, or metal plate or film as those used in the sealing above is usable. The polymer film is preferably used from the viewpoint of light weight and thin layer formation property.

[Anode]

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO. A material such as IDIXO ($In_2O_3$—ZnO) capable of forming an amorphous and transparent conductive layer may be used.

The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When a coatable material such as an organic conductive compound is used, a wet coating method such as a printing method or a coating method can be used. When light is emitted through the anode, the transmittance of the anode is preferably 10% or more, and the sheet resistance of the anode is preferably not more than several hundreds $\Omega/\square$. The thickness of the layer is ordinarily within the range of from 10 to 1000 nm, and preferably from 10 to 200 nm, although it may vary due to kinds of materials used.

[Cathode]

On the other hand, for the cathode, the transparent electrode in the invention is usable.

EXAMPLES

The present invention will be explained below with reference to examples, but the present invention is not limited to these. In examples, "part" or "%" represents "part by mass" or "% by mass, respectively, unless otherwise specified.

Example 1

(Conductive Fibers)

In this example, silver nanowires and carbon nanowires were employed as the conductive fibers. The silver nanowires were prepared according to the method described in Adv. Mater., 2002, 14, 833-837. As the carbon nanowires was employed VGNF (trade name), carbon fibers (with an average fiber diameter of 80 nm and an average fiber length of 10 μm) according to a gas phase method produced by Showa Denko Co., Ltd.

(Preparation of Conductive Fibers 1 (Silver Nanowires))

<Nucleus Formation Process>

One hundred ml of an ethylene glycol (EG) solution of silver nitrate (silver nitrate concentration: $1.5 \times 10^{-4}$ mol/L) were added in 10 seconds at a fixed flow rate while stirring to 1,000 ml of EG at 170° C. in a reaction vessel. Then, the resulting reaction solution was subjected to ripening for 10 minutes at 170° C. to form silver nucleus particles. The reaction solution after the ripening exhibited a yellow color due to surface plasmon absorption of the silver nanoparticles, whereby it was confirmed that silver ions were reduced to produce silver nanoparticles.

<Grain Growth Process>

Then, employing a double-jet precipitation method, 1200 ml of a silver nitrate EG solution (silver nitrate concentration: $1.0 \times 10^{-1}$ mol/L) and 1,000 ml of a PVP (polyvinyl pyrrolidone) EG solution (VP converted concentration: $5.0 \times 10^{-1}$ mol/L) were added at 170° C. in 80 minutes at a fixed flow rate while stirring to the ripened reaction solution containing the nucleus particles. The reaction solution was extracted every 20 minutes during the grain growth process and observed with an electron microscope. As a result, it was confirmed that silver nanoparticles formed at the nucleus formation process grew mainly in the major axis direction of the nanowires with time.

<Washing Process>

After the grain growth process, the reaction solution was cooled to room temperature, filtered using an ultrafiltration member (with a molecular weight cutoff of 10000) and desalted to obtain silver nanowires. The obtained silver nanowires were re-dispersed in ethanol. Filtration of the silver nanowires with an ultrafiltration member and the re-dispersion in ethanol were repeated 5 times, and finally, the silver nanowire ethanol dispersion solution was prepared, thereby preparing silver nanowires.

A small amount of the dispersion solution was extracted and observed with the electron microscope, and as a result, it was confirmed that silver nanowires with an average diameter of 24 nm and an average length of 40 μm were formed.

(Preparation of Conductive Fibers 2 (Silver Nanowires))

Conductive fibers 2 were prepared in the same manner as in conductive fibers 1, except that 500 ml of a PVP EG solution (VP converted concentration: $2.0 \times 10^{-1}$ mol/L) were added in 160 minutes.

A small amount of the dispersion solution was extracted and observed with the electron microscope, and as a result, it was confirmed that silver nanowires with an average diameter of 60 nm and an average length of 36 μm were formed.

(Transparent Conductive Material)

In this example, PEDOT/PSS (poly(3,4-ethylenedioxythiophene)-polystyrenesulfonate) was employed as the transparent conductive material. As a PEDOT/PSS dispersion solution, Baytron® PH510 (produced by H.C. Starck Co., Ltd.) was employed. In the preparation of transparent electrodes, coating of the conductive fibers and the transparent conductive material was carried out employing an applicator.

<<Preparation of Transparent Electrode TC-1>>

A transparent electrode was prepared according to the preferred preparation process of the transparent electrode of the invention as described above.

A PET film with the surface smoothness, Ry of 35 nm and Ra of 2 nm was employed as a releasing substrate. The surface of the PET film was subjected to corona discharge treatment. The silver nanowire dispersion solution was coated on the resulting PET film and dried so that the deposition amount of the conductive fibers 1 was 80 mg/m², thereby forming a silver nanowire network structure on the PET film.

A PEDOT/PSS dispersion solution containing 5% of DMSO was coated as a transparent conductive material on the silver nanowire network structure obtained above, dried to give a dry thickness of 100 nm, and then subjected to heat treatment at 80° C. for 30 minutes. Thus, the transparent conductive layer in the invention was formed.

In the above process, PEDOT/PSS permeates into the gaps in the silver nanowire network structure. Accordingly, the transparent conductive layer in the invention contains silver nanowires and PEDOT/PSS, which are also contained at the interface between the conductive layer and the PET film.

Subsequently, the UV curable transparent resin (NN803, produced by JSR Co., Ltd.) was coated as an adhesion layer on a PET film with a barrier layer and an adhesion assisting layer (with a total optical transmittance of 90%), dried and laminated on the above-described transparent conductive layer in the invention. The laminated material was subjected to UV irradiation to sufficiently cure the adhesion layer, and then, the PET film as the releasing substrate was separated from the laminates. Thus, the transparent conductive layer was transferred onto the PET film. Thus, Transparent electrode TC-1 was prepared.

<<Preparation of Transparent Electrode TC-2>>

Transparent electrode TC-2 was prepared in the same manner as transparent electrode TC-1, except that a 2% by mass VGNF (carbon nanowire) aqueous dispersion solution was used instead of the silver nanowire dispersion solution (conductive fibers 1).

<<Preparation of Transparent Electrode TC-3>>

Transparent electrode TC-3 was prepared in the same manner as transparent electrode TC-1, except that the silver nanowire dispersion solution (conductive fibers 1), after filtered with a polyester mesh with a pore size of 60 μm (produced by Clever Co., Ltd.) to remove coarse particles, was employed.

<<Preparation of Transparent Electrode TC-4>>

Transparent electrode TC-4 was prepared in the same manner as transparent electrode TC-1, except that the silver nanowire dispersion solution (conductive fibers 1), after filtered with a polyester mesh with a mesh size of 1 μm (produced by Clever Co., Ltd.) to remove coarse particles, was employed.

<<Preparation of Transparent Electrode TC-5>>

Transparent electrode TC-5 was prepared in the same manner as transparent electrode TC-4, except that a 2% by mass VGNF aqueous dispersion solution was employed instead of the silver nanowire dispersion solution (conductive fibers 1).

<<Preparation of Transparent Electrode TC-6>>

Transparent electrode TC-6 was prepared in the same manner as transparent electrode TC-1, except that the silver nanowire dispersion solution (conductive fibers 1), after filtered with a polyester mesh with a pore size of 1 μm (produced by Clever Co., Ltd.) to remove coarse particles and further filtered under reduced pressure with a cellulose acetate type membrane filter with a nominal filter pore size of 1 μm (produced by Advantec Co., Ltd.), was used.

The filters used were exchanged every time when they clogged. The nanowire particles remaining in the filters are incorporated in a PVP ethanol solution (solvent volume ratio, VP converted concentration: $5 \times 10^{-1}$ mol/L) and adjusted so that the nanowire concentration in the PVP ethanol solution was the same as that before filtration.

<<Preparation of Transparent Electrode TC-7>>

Transparent electrode TC-7 was prepared in the same manner as transparent electrode TC-1, except that the silver nanowire dispersion solution (conductive fibers 1), after filtered with a polyester mesh with a mesh size of 1 μm (produced by Clever Co., Ltd.) to remove coarse particles and further filtered under reduced pressure with a cellulose acetate type membrane filter with a nominal filter pore size of 1 μm (produced by Advantec Co., Ltd.), was used.

An ordinary filtration (dead end) under reduced pressure filtration cannot be carried out because of clogging of the filter due to the silver nanowires. Accordingly, a filtration method without the filter paper clogging (a disc rotation type filtration) was employed, in which the mother solution was stirred with a stirrer and the silver nanowires remained in the mother solution. When the mother solution was ¼ of the initial amount, a PVP ethanol solution (VP converted concentration: $5.0 \times 10^{-1}$ mol/L) was added thereto to give the initial mother solution amount. This addition process was repeated five times.

<<Preparation of Transparent Electrode TC-8>>

Transparent electrode TC-8 was prepared in the same manner as transparent electrode TC-6, except that the silver nanowire dispersion solution (conductive fibers 2) was employed.

The total optical transmittance and surface resistivity of the transparent electrodes TC-101 through TC-108 obtained above were measured using the following methods.

[Total Optical Transmittance]

The total optical transmittance was measured using a haze meter HGM-2B produced by Suga Test Instruments Co., Ltd., based on JIS K 7361-1:1997.

[Surface Resistivity]

The surface resistivity was measured using Rolester GP (Model MCP-T610) produced by Mitsubishi Chemical Co. Ltd., based on JIS K 7194:1994.

[Aspect Ratio]

The particles in the transparent conductive layer were confirmed by the photographic image photographed with a scanning electron microscope. Thus, the major axis length and minor axis length of 600 particles arbitrarily selected from among the particles in the photographic image photographed with a scanning electron microscope by a magnification factor of 50000 were measured. The content ratio of the particles as shown in Table 1 was calculated from the measurements.

[Surface Roughness (Ra, Ry)]

In the invention, Ry representing the smoothness of the conductive layer surface means a maximum height (the vertical interval between the summit part and a bottom part in the surface profile), and is a value according to the surface roughness specified by JIS B601 (1994). In the invention, Ry can be measured by means of a commercially available atomic force microscope (Atomic Force Microscopy: AFM) and was measured act the following method.

As the AFM, SPI3800N probe station and an SPA400 multifunctional-capability type module made by Seiko Instruments Co., Ltd., were used. The sample cut off in a square having a side of about 1 cm was set on a level sample stand on a piezo scanner, and then, a cantilever was allowed to approach to the sample surface. When the cantilever reached the region where an atomic force functioned, the cantilever was scanned in the XY direction, and displacement of the piezo element in the Z direction was measured as irregularity of the sample surface. As the piezo scanner, a piezo scanner capable of scanning the XY direction of 20 μm and the Z direction of 2 μm was used for the measurement. The cantilever used was a silicon cantilever SI-DF20 produced by Seiko Instruments Co., Ltd. with a resonant frequency of 120 to 150 kHz and a spring constant of 12 to 20 N/m, and measurement was carried out at a scanning frequency of 10.1 Hz in the DFM mode (Dynamic Force Mode). The measurement area was 80×80 μm.

TABLE 1

| Transparent electrode | Average minor axis length (nm) | Average major axis length (μm) | Surface filtration | Depth filtration | Content ratio of particles with an aspect ratio of not less than 100 (%) | Ry (nm) | Total optical transmittance (%) | Surface resistivity (Ω/□) | Remarks |
|---|---|---|---|---|---|---|---|---|---|
| TC-1 | 24 | 60 | None | None | 98.9 | 48 | 84 | 10 | Comparative |
| TC-2 | 78 | 11 | None | None | 98.7 | 46 | 79 | 10 | Comparative |
| TC-3 | 24 | 60 | Done | None | 99.2 | 42 | 84 | 10 | Inventive |
| TC-4 | 24 | 60 | Done | None | 99.3 | 32 | 84 | 10 | Inventive |
| TC-5 | 78 | 11 | Done | None | 99.5 | 22 | 79 | 10 | Inventive |
| TC-6 | 24 | 60 | Done | Done | 99.7 | 16 | 84 | 10 | Inventive |
| TC-7 | 24 | 60 | Done | Done | 99.7 | 16 | 85 | 10 | Inventive |
| TC-8 | 60 | 36 | Done | Done | 99.7 | 12 | 88 | 9 | Inventive |

As is apparent from Table 1, the inventive transparent electrodes provide substantially the same total optical transmittance (%) and surface resistivity (Ω/□) as the conventional ones, but provide superior surface smoothness Ry as compared with the conventional ones.

Example 2

[Preparation of Organic Electroluminescence Element (Organic EL Element)]

Employing each of transparent electrodes TC-1 through TC-8 prepared in Example 1 as an anode electrode, organic EL elements OEL-1 through OEL-8 were prepared according to the following procedures:

<Formation of Hole Transporting Layer>

A hole transporting layer forming coating solution, in which a hole transporting material 4,4'-bis[N-(1-naphthyl)-N-phenylamino]biphenyl (NPD) was dissolved in 1,2-dichloroethane to obtain a 1% by mass solution of the hole transporting material, was coated on the anode, and dried at 80° C. for 60 minutes to form a hole transporting layer with a thickness of 40 nm.

<Formation of Light Emission Layer>

A red light emission dopant $BtP_2Ir(acac)$, a green light emission dopant $Ir(ppy)_3$ and a blue light emission dopant FIr(pic) were mixed with polyvinyl carbazole (PVK), so as to give a content of 1% by mass, a content of 2% by mass, and a content of 3% by mass, respectively, each content based on the amount of polyvinyl carbazole (PVK). A light emission layer forming coating solution, in which the resulting mixture was dissolved in 1,2-dichloroethane to give a total solid content of 1% by mass, was coated on the resulting hole transporting layer, and dried at 100° C. for 10 minutes to form a light emission layer with a thickness of 60 nm.

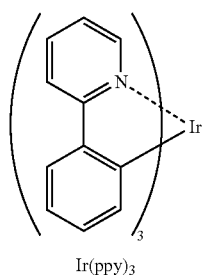

Ir(ppy)$_3$

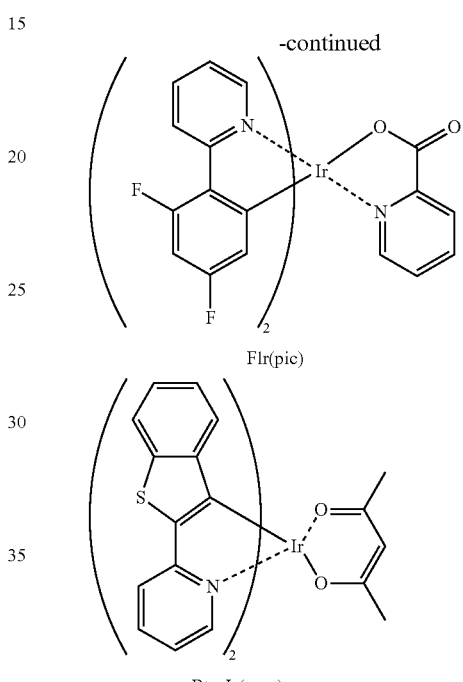

FIr(pic)

Btp$_2$Ir(acac)

<Formation of Electron Transporting Layer>

LiF as an electron transporting layer forming material was vapor deposited onto the resulting light emission layer under a vacuum pressure of $5\times10^{-4}$ Pa to form an electron transporting layer having a thickness of 0.5 nm.

<Formation of Cathode Electrode>

Al was vapor deposited onto the resulting electron transporting layer under a vacuum pressure of $5\times10^{-4}$ Pa to form a cathode electrode having a thickness of 100 nm.

<Formation of Sealing Film>

A 300 nm thick $Al_2O_3$ was vapor evaporated on a polyethylene terephthalate substrate to prepare a flexible sealing member. An adhesive agent was coated around a cathode electrode except end portions in such a way that externally taken-out terminals of the anode and cathode electrodes were formed. The resulting cathode was laminated onto the foregoing flexible sealing member, and subjected to heat treatment to cure the adhesive agent.

[Evaluation]

A direct current voltage was applied to each of the resulting organic EL elements, employing Source-Measure Unit 2400 Type produced by KEITHLEY Co., Ltd. to produce light emission. When a 300 cd light was emitted from each of the organic EL elements OLE-1 through OEL-8, uniformity of the emission light was observed according to a 50-power microscope.

(Uniformity of Emission Light)
A: Uniform light is emitted from the whole of the organic EL element.
B: Nearly uniform light is emitted from the whole of the organic EL element.
C: Nearly uniform light is emitted from the whole of the organic EL element, which is inferior to ranking C.
D: A slight of unevenness is observed in light emitted from the organic EL element.
E: A slight of unevenness is observed in light emitted from the organic EL element, which is inferior to ranking D.
F: Apparent unevenness is observed in light emitted from the organic EL element.
G: No light emission from the organic EL element is observed.

(Product Lifetime)

In the same way as in evaluation of the above luminance unevenness (uniformity of emission light), a direct current voltage was applied to each of the resulting organic EL elements, employing Source-Measure Unit 2400 Type produced by KEITHLEY Co., Ltd. to produce light emission. After voltage was applied to each of the organic EL elements for 10000 hours, uniformity of the emission light emitted from each of the organic EL elements was observed according to a 50-power microscope. The evaluation criteria were the same as those employed in evaluation of luminance unevenness (uniformity of emission light) above.

The results are shown in Table 2.

TABLE 2

| Organic EL Element | Luminance unevenness | Lifetime | Remarks |
| --- | --- | --- | --- |
| OLE-1 | D | F | Comparative |
| OLE-2 | D | F | Comparative |
| OLE-3 | B | D | Inventive |
| OLE-4 | B | C | Inventive |
| OLE-5 | B | C | Inventive |
| OLE-6 | A | B | Inventive |
| OLE-7 | A | B | Inventive |
| OLE-8 | A | A | Inventive |

As is apparent from Table 2, the inventive organic EL elements provide excellent light emission uniformity and long product lifetime.

EXPLANATION OF SYMBOLS

11: Conductive fiber
21: Transparent conductive material
31: Transparent conductive layer
41. Transparent binder
42. Transparent binder layer
51. Transparent substrate

The invention claimed is:

1. A transparent electrode comprising a transparent substrate and provided thereon, a transparent conductive layer containing conductive fibers and a transparent conductive material, wherein the content rate of conductive fibers with an aspect ratio of not less than 100 contained in the transparent conductive layer is 99.00% by number or more of the total number of the conductive fibers.

2. The transparent electrode of claim 1, wherein the content rate of the conductive fibers with an aspect ratio of not less than 100 is 99.50% by number or more of the total number of the conductive fibers.

3. The transparent electrode of claim 1, wherein the conductive fibers have an average minor axis length of from 30 nm to less than 100 nm, and an average major axis length of from 10 μm to less than 30 μm.

4. A purifying method of conductive fibers employed in transparent electrode the method comprising the step of:
purifying the conductive fibers employing a filter having a surface filtration mechanism, the transparent electrode comprising a transparent substrate and provided thereon, a transparent conductive layer containing the conductive fibers and a transparent conductive material, wherein the content rate of conductive fibers with an aspect ratio of not less than 100 contained in the transparent conductive layer is 99.00% by number or more of the total number of the conductive fibers.

5. The purifying method of claim 4, wherein the filter having a surface filtration mechanism is in the form of mesh.

6. The purifying method of claim 4, wherein a circle converted average pore size of the filter having a surface filtration mechanism is larger than the average minor axis length of the conductive fibers and smaller than the average major axis length of the conductive fibers.

7. The purifying method of claim 4, wherein the purifying is further carried out employing a filter having a depth filtration mechanism.

8. The purifying method of claim 7, wherein a pore size of the filter having a depth filtration mechanism is larger than the average minor axis length of the conductive fibers and smaller than the average major axis length of the conductive fibers.

9. An organic electroluminescence element comprising a transparent electrode comprising a transparent substrate and provided thereon, a transparent conductive layer containing conductive fibers and a transparent conductive material, wherein the content rate of conductive fibers with an aspect ratio of not less than 100 contained in the transparent conductive layer is 99.00% by number or more of the total number of the conductive fibers.

* * * * *